United States Patent
Anderson et al.

[11] Patent Number: 5,969,461
[45] Date of Patent: Oct. 19, 1999

[54] SURFACE ACOUSTIC WAVE DEVICE PACKAGE AND METHOD

[75] Inventors: Michael J. Anderson, Phoenix; Gregory Kennison, Mesa; Jeffrey E. Christensen, Scottsdale; Gary C. Johnson, Tempe; Jon G. Aday, Gilbert, all of Ariz.

[73] Assignee: CTS Corporation, Elkhart, Ind.

[21] Appl. No.: 09/057,144

[22] Filed: Apr. 8, 1998

[51] Int. Cl.[6] ............................ H01L 41/08; H03H 9/25
[52] U.S. Cl. ................. 310/313 R; 310/340; 310/348; 333/193; 29/841; 264/272.11; 174/260; 174/261; 361/760; 361/772; 361/777
[58] Field of Search ................. 361/748, 760, 361/768, 772, 777, 782, 783; 310/313 R, 340, 348, 349; 333/150, 193; 367/140; 257/728, 737, 738, 778, 786–796; 438/124, 126, 127; 264/272.11, 272.16, 272.17; 29/25.35, 841; 174/52.2, 52.3, 260, 261

[56] References Cited

U.S. PATENT DOCUMENTS

| | | | |
|---|---|---|---|
| 3,657,610 | 4/1972 | Yamamoto et al. | 257/778 |
| 4,191,905 | 3/1980 | Yasuda et al. | 310/344 |
| 4,266,156 | 5/1981 | Kizaki | 310/344 |
| 4,405,875 | 9/1983 | Nagai | 310/344 |
| 4,604,644 | 8/1986 | Beckham et al. | 357/80 |
| 4,661,192 | 4/1987 | McShane | 156/292 |
| 4,699,682 | 10/1987 | Takishima | 156/292 |
| 4,734,608 | 3/1988 | Takoshima et al. | 310/313 R |
| 4,736,128 | 4/1988 | Takoshima et al. | 310/313 R |
| 4,737,742 | 4/1988 | Takoshima et al. | 333/150 |
| 4,864,470 | 9/1989 | Nishio | 361/400 |
| 4,993,000 | 2/1991 | Niitsuma et al. | 367/140 |
| 5,014,111 | 5/1991 | Tsuda et al. | 357/68 |
| 5,090,119 | 2/1992 | Tsuda et al. | 29/843 |
| 5,095,240 | 3/1992 | Nysen et al. | 310/313 R |
| 5,120,678 | 6/1992 | Moore et al. | 437/183 |
| 5,252,882 | 10/1993 | Yatsuda | 310/313 R |
| 5,281,883 | 1/1994 | Ikata et al. | 310/313 R |
| 5,359,494 | 10/1994 | Moritomo | 361/760 |
| 5,390,401 | 2/1995 | Shikata et al. | 29/25.35 |
| 5,438,305 | 8/1995 | Hikita et al. | 333/32 |
| 5,459,368 | 10/1995 | Onishi et al. | 310/313 R |
| 5,471,722 | 12/1995 | Yatsuda | 29/25.35 |
| 5,504,980 | 4/1996 | Yoshinaga et al. | 29/25.35 |
| 5,900,581 | 5/1999 | Ootake | 257/778 |

FOREIGN PATENT DOCUMENTS

| | | |
|---|---|---|
| 2-186662 | 7/1990 | Japan . |
| 5-090882 | 4/1993 | Japan . |

*Primary Examiner*—Leo P. Picard
*Assistant Examiner*—John B. Vigushin
*Attorney, Agent, or Firm*—Jones, Day, Reavis & Pogue

[57] ABSTRACT

A method for packaging an acoustic wave device (10) without contaminating an active area (12) disposed on a face (14) thereof, including steps of: providing a substrate with a top (30) having conductive pads (18), bonding stud bumps (20) to a periphery (22) of the face (14) of the acoustic wave device, disposing a dam (26) onto the top (30) of the substrate and inside of the location of the conductive pads (18), aligning and connecting the stud bumps (20) to the conductive pads (18) on the top of the substrate to form electrically conductive interconnections between the acoustic wave device (10) and the substrate (16), flowing an underfill material (28) at the periphery (22) of the acoustic wave device and around the interconnections such that the underfill material (28) stops at a boundary (32) defined by the dam (26), and curing the underfill material (28) to mechanically reinforce and protectively encapsulate the interconnections.

23 Claims, 1 Drawing Sheet

SURFACE ACOUSTIC WAVE DEVICE PACKAGE AND METHOD

FIELD OF THE INVENTION

This invention relates in general to the field of packaging for frequency selection components, in particular to packaging of surface acoustic wave frequency selection components and more particularly to an improved package for surface acoustic wave frequency selection components.

BACKGROUND OF THE INVENTION

Surface acoustic wave (SAW) devices are frequently used in commercial and other applications as RF and IF filters to provide frequency selectivity and other electronic functions. A SAW device depends upon acoustic wave generation. In some cases these acoustic waves are localized to the surface of the substrate. The substrates are piezoelectric materials. Because the acoustic waves in a SAW device often propagate along or very near the surface, SAW devices are generally very sensitive to surface conditions. This sensitivity is not of a chemical or electronic charge nature as it is, for example, in the case of semiconductors, but is of a mechanical nature. For example, foreign material in contact with the surface of a SAW device can change the elastic and inertial properties of the surface thereby altering the attenuation and propagation of acoustic waves moving along on the surface.

Present day SAW devices are typically packaged in hermetic enclosures because of this surface sensitivity. Low cost packaging techniques which are, for example, widely used in connection with semiconductor devices and integrated circuits are not generally used in connection with SAW devices. For example, simple transfer molding of plastic enclosures has not been practicable. In transfer molding, a plastic material in a heated and molten state is forced through channels in a mold to surround the active device die, under pressure, to create a plastic enclosure. This process destroys SAW device performance if it directly coats the surface of the SAW with mold compound.

Nearly all current SAW devices depend upon the use of hermetic packaging techniques for environmental protection because of this problem. Ceramic or metal enclosures with solder or welded seal construction are common. Hermetic packaging is generally costly in terms of both the piece parts required and in the encapsulation processing. As the technology for fabricating SAW die themselves has improved, the packaging costs have become an increasingly larger share of the total manufacturing costs.

Accordingly, there continues to be a need for improved means and methods for encapsulating SAW devices, especially those which permit one to employ low cost plastic encapsulation techniques.

It is an advantage of the present invention, that SAW devices can be encapsulated in plastic using conventional injection or transfer molding techniques in a manner that preserves the desirable electrical characteristics of the encapsulated SAW device.

DETAILED DESCRIPTION OF THE PREFERRED EMBODIMENT

As used herein, the term "surface acoustic wave (SAW) device" refers to devices such as Rayleigh wave filters, surface skimming bulk wave filters and other devices employing acoustic eigenmodes.

The present invention provides a package that encapsulates a SAW device and a method for producing the package employing low cost plastic encapsulation techniques. The SAW devices can be encapsulated in plastic using conventional injection or transfer molding techniques in a manner that preserves the desirable electrical characteristics of the encapsulated SAW device.

Figure 1:
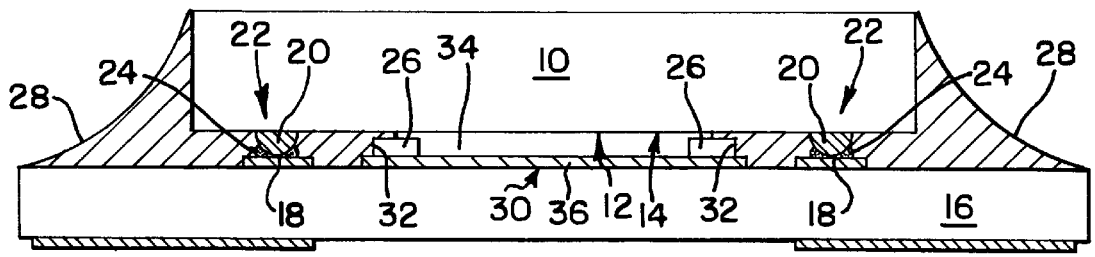
FIG. 1 is a sectional view of a first embodiment of a packaged SAW filter, in accordance with the present invention.
Figure 2:
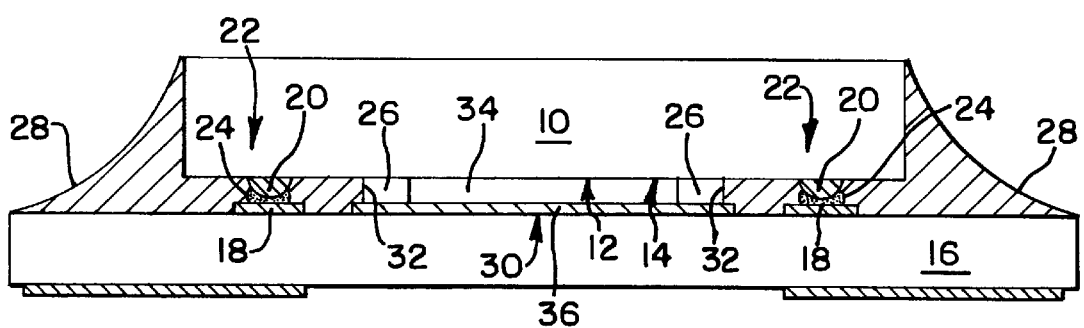
FIG. 2 is a sectional view of a second embodiment of a packaged SAW filter, in accordance with the present invention.
Figure 3:
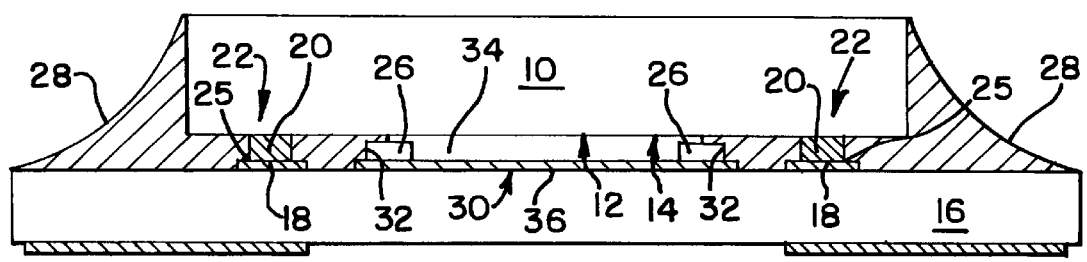
FIG. 3 is a sectional view of a preferred embodiment of the packaged SAW filter, in accordance with the present invention.

FIGS. 1–3 show side sectional views of SAW device package embodiments, in accordance with the present invention. In each embodiment the package includes an acoustic wave device 10 having an active area 12 on a face 14 thereof. The active area 12 is isolated within a periphery 22 of the device 10 to prevent contamination. Surface acoustic wave (SAW) devices are well known in the art and typically include interdigitated electrodes (not shown) of various configurations disposed on the active area of the face so as to support acoustic waves thereupon. Generally, electrical traces (not shown) connect to the interdigitated electrodes and run to a periphery of the device to facilitate external electrical contact with the device without disturbing or dampening vibrations within the active area of the device. Specific configurations of the SAW device electrodes and traces need not be discussed here as the present invention can be used to package all types of SAW devices having active areas isolated within a periphery of the device.

The SAW device package includes a substrate 16 with a top 30 and a plurality of conductive pads 18, 36 disposed thereupon. The substrate 16 is a material chosen from one of the group of FR-4 polyimide, BT-epoxy, and alumina, and the like. Substrates having conductive pads disposed thereon are numerous in the art and will not be discussed here. However, it should be noted that choosing a substrate material having a similar coefficient of thermal expansion as the SAW device improves the frequency versus temperature performance of the SAW device.

In the present invention, a plurality of stud bumps 20 are electrically connected to the face 14 of the acoustic wave device 10 and arranged near the periphery 22 of the acoustic wave device 10. The stud bumps are utilized to provide electrical connections through electrical traces to the electrodes (not shown) of the SAW device. The stud bumps 20 are located in predetermined positions that correspond to a mirror image of the positions of the conductive pads 18 of the substrate 16. In this way, the stud bumps are registered with the conductive pads during assembly. As shown, the stud bumps 20 are aligned in proximity to the conductive pads 18. The stud bumps comprise a metal or alloy containing at least one of gold, aluminum, and copper and are typically bonded on a wire bonder using wires of about twenty-five to fifty micrometers in thickness. Gold stud bumps are desired because they are (i) chemically inert, (ii) visible on X-ray photographs for defect analysis and (iii) robust during subsequent encapsulation processes.

In FIGS. 1 and 2, a conductive material 24 is interposed between the stud bumps 20 and conductive pads 18. The conductive material 24 forms mechanical and electrical interconnections coupling the acoustic wave device 10 to the substrate 16. The conductive material can comprise a solder or a conductive adhesive such as a conductive epoxy, a conductive silicone, and the like. The stud bumps can be either dipped or placed into the conductive material. Specifically, the conductive material can be disposed with a thickness of about ten micrometers directly onto the stud bumps before the attachment of the SAW device to the substrate. Alternatively, the conductive material can be disposed with a thickness of about twenty-five to fifty micrometers directly onto the conductive pads of the substrate before the attachment of the SAW device to the substrate. Preferably, the conductive material comprises a conductive epoxy such as Amicon™ C-990 conductive epoxy available from Emerson & Cumings of Boston, Mass.

In FIG. 3, the stud bumps 20 are mechanically bonded directly to the conductive pads 18 with no intervening adhesive. This can be accomplished with thermosonic bonding, thermocompression bonding, and the like. Thermosonic bonding can be accomplished by the use of standard wirebonder. However, extra pressure and ultrasonic energy are needed along with the heating of the SAW device and/or substrate to heat up a bond area 25. In operation, the die is bumped, flipped over, aligned and placed in contact with the conductive pads, and thermosonically scrubbed onto the conductive pads at the bond area 25. With thermocompression bonding the process is essentially the same but without using ultrasonics.

In each embodiment of the present invention (FIGS. 1–3), a dam 26 is disposed on the top 30 of the substrate 16 between the substrate 16 and the acoustic wave device 10. The dam 26 is disposed within the periphery 22 of the acoustic wave device 10 and interconnections formed by the stud bumps 20 and conductive material 24. The dam can comprise any combination of plastics, thermoplastics, epoxies, alumina, glasses or other organic or inorganic materials. In addition, the material of the dam can be a photoimageable for ease of manufacture. Preferably, for cost and convenience, the dam is a photolithographically-defined standard solder mask material as is known in the art such as Probimer™ 65M Liquid Photoimageable Solder Mask made by Ciba Specialty Chemicals, 5121 San Fernando Road West, Los Angeles, Calif. 90039. The solder mask material can be patterned down to about one-hundred micrometers and maintain a uniform thickness which is important in the present invention. In practice, the dam maintains a uniform height tolerance of about five micrometers.

The dam provides several advantageous attributes; (i) it completely surrounds and encloses the active area of the device, (ii) it does not extend into active area of the device, (iii) it allows thin film traces to extend from within the active area to the periphery of the device, (iv) it separates the top of the substrate from the active area of the device to a suitable extent (at least a few micrometers), and (v) it prevents intrusion of foreign materials during overmolding and at any other time. The latter requirement includes maintaining integrity of dam under conditions of 160–190° C. at a pressure usually in a range of 500–1800 psi (with 1000 psi being typical) for a period of 30 seconds to 3 minutes, with 2 minutes being typical.

Optionally, one conductive pad 36 is interposed between the dam 26 and the top 30 of the substrate 16 to substantially cover the substrate 16 inside of the boundary 32 defined by the dam 26 to provide RF shielding and improved hermeticity where an organic substrate material is suspected of having moisture leak paths. The necessity of providing the one conductive pad 36 depends on whether the active area 12 of the SAW device 10 is glassivated (coated with a glass layer to passivate the electrodes) and what overall reliability requirements are needed. Preferably, the one conductive pad 36 is electrically grounded.

The stud bumps 20, conductive material 24 and the dam 26 have specific relationships with the face 14 of the acoustic wave device 10 and the top 30 of the substrate 16. In a first embodiment of the present invention, as shown in FIG. 1, the stud bumps 20 abut the conductive pads 18 wherein the stud bumps are touching or nearly touching the conductive pads 18. The conductive material 24 serves to reinforce the electrical connection between the stud bumps 20 and the conductive pads 18 and to provide a rigid mechanical mounting for the acoustic wave device 10. In this first embodiment, the dam 26 does not abut the face 14 of the SAW device 10, and the face of the acoustic wave device is positioned slightly above the dam such that there is no direct contact therebetween. A sealed cavity 34 for the active area 12 of the SAW device 10 is defined by the height of the stud bumps 20 between the top 30 of the substrate 16 and the face 14 of the acoustic wave device 10. Therefore, the stud bumps must be planarized (equalized in height) so as to ensure a minimal gap between the dam 26 and the face 14 of the SAW device 10. Planarized stud bumps provide a height tolerance of about ten micrometers. In addition, a minimal gap is required for the underfill material as will be explained below.

In a second embodiment of the present invention, as shown in FIG. 2, the stud bumps 20 do not touch the conductive pads 18, but are only located in proximity thereto. The stud bumps 20 are positioned slightly above the conductive pads such that there is no direct contact therebetween. The conductive material 24 serves to provide the electrical connections between the stud bumps 20 and the conductive pads 18 and to provide a rigid mechanical mounting for the acoustic wave device 10. The stud bumps 20 actually "float" in the conductive material 24. Preferably, the dam 26 abuts the face 14 of the SAW device 10 to define a sealed cavity 34 for the active area 12 of the SAW device 10 between the top 30 of the substrate 16 and the face 14 of the acoustic wave device 10. The amount of conductive material 24 is more than that used in the first embodiment and must be sufficient to compensate for irregularities in the heights of the stud bumps 20, whether planarized or not, so as to ensure a good electrical connection between all of the stud bumps 20 and their associated conductive pads 18.

More preferably, the dam has a height of about fifty-one micrometers and the stud bumps have a height of about forty-eight micrometers such that the dam abuts the face of the SAW device and the stud bumps float over the conductive pads in the conductive material. The second embodiment has the advantage of the dam abutting the face of the SAW device eliminating the possibility of underfill intrusion into the seated cavity. In addition, the second embodiment does not require the stringent planarization of the first embodiment.

In a preferred embodiment of the present invention, as shown in FIG. 3, the stud bumps 20 are mechanically bonded to the conductive pads 18 at a bond area 25. The mechanical bond is achieved by thermosonic or thermocompression bonding which provides the electrical connections between the stud bumps 20 and the conductive pads 18 and provides a very rigid mechanical mounting for the acoustic wave device 10. In either case, the die can be ultrasonically scrubbed or pressed until the die is in contact with, or just above the dam 26. Preferably, the dam 26 abuts (not represented) or nearly abuts the face 14 of the SAW device 10 to define a sealed cavity 34 for the active area 12 of the SAW device 10 between the top 30 of the substrate 16 and the face 14 of the acoustic wave device 10. More preferably, the heights of the stud bumps are planarized to provide uniform bond strength and conductivity at all the bond areas 25.

In the present invention, an underfill material 28 seals the acoustic wave device 10 to the substrate 16 at the periphery 22 of the acoustic wave device 10 between the acoustic wave device 10 and the top 30 of the substrate 16. The dam 26 provides a boundary 32 to the underfill material 28 allowing the underfill material 28 to encapsulate the interconnections (shown by 20, 24, 18) and preventing the underfill material 28 from contaminating the active area 12 on the face 14 of the acoustic wave device 10 so as to provide a sealed cavity 34 within which the active area 12 is sealed. The underfill material provides sealing, adhesion and stress relief for the interconnects.

Preferably, the underfill material is Zymet™ X6-82-5 (manufactured by Zymet Inc. of East Hanover, N.J.) or Dexter Hysol™ 4510 (manufactured by the Hysol Division of Dexter Corp. of Industry, Calif.).

The present invention also includes a method for packaging an acoustic wave device having an active area disposed on a face thereof, as represented in FIGS. 1–3. The method comprises a first step of providing a substrate with a top having conductive pads disposed thereon. The conductive pads are disposed generally in a ring pattern with electrical traces running on the top and possibly through the substrate. The substrate is of a material chosen from one of the group of FR-4 polyimide, BT-epoxy, and alumina, and the like. Techniques for disposing conductive pads on substrates are numerous in the art and will not be discussed here. However, it should be noted that choosing a substrate material having a similar coefficient of thermal expansion as the SAW device improves the frequency versus temperature performance of the SAW device.

A next step includes disposing a dam of photoimageable organic material onto the top of the substrate and inside of the location of the conductive pads. In other words, the dam is disposed within the ring pattern of the conductive pads. Preferably, this step includes disposing the dam to maintain a uniform height tolerance of about five micrometers. More preferably, this step includes disposing the dam to have a height of about fifty-one micrometers.

The disposing a dam step can comprise disposing any combination of plastics, thermoplastics, epoxies or other organic materials, any of which can be a photoimageable for ease of manufacture. Preferably, for cost and convenience, the disposing a dam step includes disposing a photolithographically-defined standard solder mask material as is known in the art such as Probimer™ 65M Liquid Photoimageable Solder Mask made by Ciba Specialty Chemicals, 5121 San Fernando Road West, Los Angeles, Calif. 90039. Preferably, the disposing step includes patterning the solder mask material down to about one-hundred micrometers and maintaining a uniform thickness which is important in the present invention. In practice, the dam maintains a uniform height tolerance of about five micrometers. Solder mask material is viewed as the most cost effective apparatus to provide a dam for the SAW device.

Optionally, one large grounded conductive pad is provided in the providing step, and the disposing step includes disposing the dam onto the one conductive pad. The one conductive pad substantially covers the substrate inside of a boundary defined by the dam to provide RF shielding and improved hermeticity where an organic substrate material is suspected of having moisture leak paths. The one conductive pad is may not be necessary where the active area of the SAW device is glassivated.

A next step includes bonding a plurality of stud bumps to a periphery of the face of the acoustic wave device. The bonding stud bumps step is utilized to provide electrical connections through electrical traces to electrodes (not shown) of the SAW device. These electrical traces are typically a deposited metal thin film. The bonding step bonds stud bumps in predetermined positions that correspond to a mirror image of the locations of the conductive pads of the substrate. In this way, the stud bumps are registered with the conductive pads during a subsequent aligning and connecting step. The bonding step is conducted on a wire bonder using wires of about twenty-five to fifty micrometers in thickness.

It should be noted that stud bump bonding is not the only method of bumping a die. There are other methods available. For example, bumps can be provided by electroplating, electroless plating, plating with a solder deposition such as in ball grid array (BGA) processing for example, sputtering and polymer printing, among others.

Preferably, the bonding step includes a substep of planarizing the stud bumps to have a uniform height tolerance of about ten micrometers. Where highly planar stud bumps are required, Matsushita's Stud Bump Bonding™ process can be used. This process is described in U.S. Pat. No. 5,090,119. Another method to planarize the bumps involves a coining operation performed by a stud bump bonder with tooling designed to tamp the stud bumps to a specific height. This method is commonly known in the art as "bump and coin". Specifically, this step includes a substep of planarizing the stud bumps to have a height of about forty-eight micrometers.

A next step includes aligning the stud bumps with their associated mirror image conductive pads and placing the stud bumps in proximity to the conductive pads.

In a first embodiment, as represented in FIG. 1, this step includes positioning the face of the acoustic wave device slightly above the dam such that there is no direct contact therebetween. The stud bumps abut or are in proximity to the conductive pads.

In a second embodiment, as represented in FIG. 2, this step includes positioning the face of the acoustic wave device to abut the dam, and includes aligning the stud bumps to be positioned slightly above the conductive pads such that there is no direct contact therebetween.

In a preferred embodiment, as represented in FIG. 3, this step includes positioning the face of the acoustic wave device slightly above the dam such that there is no direct contact therebetween. The stud bumps abut or are in proximity to the conductive pads.

A next step includes connecting the acoustic wave device onto the substrate such that the stud bumps of the acoustic wave device and the associated conductive pads of the substrate form electrical and mechanical interconnections.

In both the first and second embodiment, the connecting step includes at least partially coating the stud bumps with a conductive material which can comprise solder or a conductive adhesive such as a conductive epoxy, a conductive silicone, and the like. Preferably, the conductive material comprises a conductive epoxy partially coating the stud bump to a thickness of about ten micrometers. This can be accomplished by dipping the stud bumps into conductive epoxy by using one of Panasonic's die bonders, for example, which are commonly known in the art, or an equivalent. Alternatively, this step includes at least partially coating the conductive pads of the substrate with a conductive material to a thickness of about twenty-five to fifty micrometers. The conductive material serves to reinforce the electrical connection between the stud bumps and the conductive pads and to provide a rigid mechanical mounting for the acoustic wave device.

Also in the first and second embodiments, the connecting step further includes curing the conductive material to form solidified electrically conductive interconnections between the acoustic wave device and the substrate. Preferably, this step includes heating the conductive material to a temperature near a glass transition temperature the conductive material but less than a glass transition temperature of photoimageable organic material of the dam. More preferably, the conductive material comprises a silver-filled conductive epoxy, such as Amicon™ C-990 conductive epoxy available from Emerson & Cumings of Boston, Mass. Generally, this epoxy requires curing in a forced-air oven heated to a temperature of about 150° C. for a period of about 60 to about 90 minutes. However, it should be recognized that other conductive adhesives and processes can be used successfully since the conductive material is outside of the dam which defines the sealed cavity of the package and cannot intrude therein.

In the first embodiment of the method of the present invention, as represented in FIG. 1, the disposing step disposes the dam at a height to be below the face of the SAW device after the aligning and placing step. As a result, the face of the acoustic wave device is positioned slightly above the dam such that there is no direct contact therebetween. After the aligning and placing step, a sealed cavity is defined by the height of the stud bumps. Therefore, a substep of planarizing the stud bumps should be performed so as to ensure a minimal gap between the dam and the face of the SAW device after the aligning and placing step. A minimal gap is required for the underfill material as will be explained below.

In the second embodiment of the method of the present invention, as represented in FIG. 2, the stud bumps actually "float" in the conductive material after the aligning and placing step because the disposing step disposes the dam at a height to abut the face of the SAW device after the aligning and placing step. After the aligning and placing step, a sealed cavity around the active area of the SAW device between the SAW device and the substrate is defined by the height of the dam. The amount of conductive material of the connecting step is more than that used in the first embodiment and must be sufficient to compensate for irregularities in the heights of the stud bumps so as to ensure a good electrical connection between all of the stud bumps and their associated conductive pads.

In the preferred embodiment of the method of the present invention, as represented in FIG. 3, the disposing step disposes the dam to be below the face of the SAW device after the aligning and placing step, wherein the face of the acoustic wave device is positioned slightly above the dam such that there is no direct contact therebetween. After the aligning and placing step, a sealed cavity is defined by the height of the stud bumps. Therefore, a substep of planarizing the stud bumps should be performed so as to ensure a minimal or no gap between the dam and the face of the SAW device after the connecting step. The connecting step includes mechanically and directly connecting the stud bumps to their associated conductive pads by one of thermosonic bonding and thermocompression bonding. Preferably in either case, the die can be bonded (ultrasonically scrubbed or pressed) until the face of the SAW device abuts or nearly abuts the dam.

A next step includes flowing an underfill material at the periphery of the acoustic wave device and around the interconnections such that the underfill material flows between the face of the SAW device and the top of the substrate and stops at a boundary defined by the dam. Most underfills are designed to have very aggressive flow characteristics so that, once dispensed, the underfill will pull itself into the spaces between the SAW device and the substrate using surface tension. However, where there is a relatively large gap between the dam and the face of the SAW device the resins in the underfill material can wet into the sealed cavity. This problem can occur in the first embodiment as explained above but can be mitigated by minimizing the gap and choosing an underfill material with thixotropic properties that reduce wetting into small gaps. In particular, choosing a thicker resin than would normally be used in the art and increasing the particle size and density in the underfill material can reduce this wetting problem. Preferably, the underfill material is Zymet™ X6-82-5 or Dexter Hysol™ 4510 (manufactured by the Hysol Division of Dexter Corp. of Industry, Calif.), and is applied so as to flow around the interconnections to encapsulate the interconnections, but not to wet through the gap into the active area of the acoustic wave device.

A last step includes curing the underfill material to mechanically reinforce and protectively encapsulate the interconnections and provides a sealed package within which the cavity around the active area is sealed. For the Dexter Hysol™ 4510, curing is accomplished by curing in a forced-air oven heated to a temperature of about 150° C. for a period of about 180 minutes.

Additionally, the method of the present invention can further include attaching external electrical leads to the substrate and overmolding the acoustic wave device with a package body material or encapsulant comprising one of the group consisting of thermoplastic, thermosetting plastic, and epoxy so as to present a package that is easier for a user to handle in accordance with industry norms. This step provides a complete packaging solution. Proper selection of transfer molding compounds for matching of thermal coefficients of expansion to those of the substrate material and die, or of a suitable average of the thermal coefficient of expansion, would benefit the frequency-temperature performance of the SAW device.

The package body material or encapsulant is usefully Type 6300H epoxy molding compound available from Sumitomo Plastics of Santa Clara, Calif. This epoxy is employed in standard 8 lead SOIC (small outline integrated circuit) processes wherein the epoxy is transfer molded about the acoustic wave device and substrate at a pressure of about 1000 pounds per square inch and a temperature of about 175° C., which temperature is chosen to be at or above the glass transition temperature of the epoxy yet lower than the glass transition temperature of dam to avoid melting of dam. The temperature and pressure are maintained for a period of about two minutes. It will be appreciated that other types of standard transfer molded packages (e.g., 14 lead SOIC) are useful in this process.

Thus, a SAW device package and method have been described which overcomes specific problems and accomplishes certain advantages relative to prior art methods and mechanisms. The improvements over known technology are significant. The expense, complexities, and high labor content of prior art hermetic packages are avoided. Similarly, the benefits of moisture and shock resistance are maintained, while savings in volume and weight of the completed filter have been achieved.

It should be recognized that others can, by applying current knowledge, readily modify or adapt the above embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the broad scope of the appended claims.

What is claimed is:

1. A package for an acoustic wave device having an active area on a face thereof, the package comprising:

a substrate with a top surface and a plurality of conductive pads disposed thereon;

a plurality of stud bumps electrically connected to the face of the acoustic wave device and arranged near a periphery of the acoustic wave device, the stud bumps being aligned in proximity to the conductive pads and coupled to the conductive pads to form interconnections;

a dam disposed on the top surface of the substrate between the substrate and the acoustic wave device, the dam disposed within the periphery of the acoustic wave device and interconnections; and an underfill material sealing the acoustic wave device to the substrate between the periphery of the acoustic wave device and the top surface of the substrate, the dam providing a boundary to the underfill material allowing the underfill material to encapsulate the interconnections and preventing the underfill material from contacting the active area on the face of the acoustic wave device so as to provide a sealed cavity within which the active area is sealed.

2. The package of claim 1, further comprising a conductive material interposed between the stud bumps and conductive pads, the conductive material forming mechanical and electrical interconnections coupling the acoustic wave device to the plurality of conductive pads on the top surface of the substrate.

3. The package of claim 2, wherein the dam abuts the face of the acoustic wave device, and wherein the stud bumps are positioned slightly above the conductive pads such that there is no direct contact therebetween.

4. The package of claim 2, wherein the dam has a height of about fifty-one micrometers and the stud bumps have a height of about forty-eight micrometers.

5. The package of claim 1, wherein the dam has a uniform height tolerance of about five micrometers and the stud bumps are planarized to have a uniform height tolerance of about ten micrometers.

6. The package of claim 1, wherein the stud bumps abut the conductive pads, and wherein the face of the acoustic wave device is positioned slightly above the dam such that there is no direct contact therebetween.

7. The package of claim 1, wherein the stud bumps abut the conductive pads and are mechanically bonded to the conductive pads, and wherein the face of the acoustic wave device abuts the dam.

8. The package of claim 1, wherein one conductive pad is interposed between the dam and the substrate, the one conductive pad substantially covering the substrate inside of the boundary defined by the dam to provide RF shielding and improved hermeticity.

9. The package of claim 1, wherein the substrate is a material chosen from one of the group of FR-4 polyimide, BT-epoxy, and alumina.

10. The package of claim 1, wherein the dam comprises a material consisting of at least one of the group of plastics, thermoplastics, epoxies, alumina, glasses, organic or inorganic material, and photoimageable organic material.

11. A method for packaging an acoustic wave device having an active area disposed on a face thereof, the method comprising the steps of:

providing a substrate with a top surface having a plurality of conductive pads disposed thereon;

disposing a dam onto the top surface of the substrate and inside of the location of the conductive pads;

bonding a plurality of stud bumps to a periphery of the face of the acoustic wave device;

aligning the stud bumps with their associated mirror image conductive pads and placing the stud bumps in proximity to the conductive pads on the top surface of the substrate;

connecting the acoustic wave device onto the substrate such that the stud bumps of the acoustic wave device and the associated conductive pads of the substrate form electrical and mechanical interconnections;

flowing an underfill material at the periphery of the acoustic wave device and around the interconnections such that the underfill material stops at a boundary defined by the dam; and curing the underfill material to mechanically reinforce and protectively encapsulate the interconnections and provide a sealed cavity within which the active area is sealed.

12. The method of claim 11, wherein the disposing step includes disposing a dam comprising a material consisting of at least one of the group of plastics, thermoplastics, epoxies, alumina, glasses, organic or inorganic material, and photoimageable organic material.

13. The method of claim 11, wherein the connecting step includes substeps of: at least partially coating the stud bumps with a conductive material; and curing the conductive material to form solidified electrically conductive interconnections between the acoustic wave device and the substrate.

14. The method of claim 13, wherein the curing the conductive material substep includes heating the conductive material to a temperature near a glass transition temperature of the conductive material and less than a glass transition temperature of the dam.

15. The method of claim 13, wherein the aligning and placing step includes placing the face of the acoustic wave device to abut the dam, and includes aligning the stud bumps to be positioned slightly above the conductive pads such that there is no direct contact therebetween.

16. The method of claim 13, wherein the disposing step includes disposing the dam to have a height of about fifty-one micrometers, and wherein the bonding step includes a substep of planarizing the stud bumps to have a height of about forty-eight micrometers.

17. The method of claim 11, wherein the connecting step includes mechanically bonding the stud bumps directly to the conductive pads using one of the group consisting of thermosonic bonding and thermocompression bonding.

18. The method of claim 11, wherein the aligning and placing step includes placing the stud bumps to abut the conductive pads, and includes positioning the face of the acoustic wave device slightly above the dam such that there is no direct contact therebetween.

19. The method of claim 11, further comprising the step of overmolding the acoustic wave device with a package body material comprising one of the group consisting of thermoplastic, thermosetting plastic, and epoxy.

20. The method of claim 11, wherein the disposing step includes disposing the dam to have a uniform height tolerance of about five micrometers, and wherein the bonding step includes a substep of planarizing the stud bumps to have a uniform height tolerance of about ten micrometers.

21. A method for packaging an acoustic wave device having an active area disposed on a face thereof, the method comprising the steps of:

providing a substrate with a top surface having a plurality of conductive pads disposed thereon;

disposing a dam of photoimageable organic material onto the top surface of the substrate and inside of the location of the conductive pads;

bonding a plurality of stud bumps to a periphery of the face of the acoustic wave device;

aligning the stud bumps with their associated mirror image conductive pads and placing the stud bumps to abut the conductive pads and positioning the face of the acoustic wave device slightly above the dam such that there is no direct contact therebetween;

mechanically bonding the stud bumps directly to the conductive pads forming electrical and mechanical interconnections;

flowing an underfill material at the periphery of the acoustic wave device and around the interconnections such that the underfill material stops at a boundary defined by the dam; and curing the underfill material to mechanically reinforce and protectively encapsulate the interconnections and provide a sealed cavity within which the active area is sealed.

22. The method of claim 21, wherein the mechanically bonding step includes one of the group consisting of thermosonic bonding and thermocompression bonding.

23. The method of claim 22, wherein the mechanically bonding step includes bonding the stud bumps into the conductive pads until the face of the acoustic wave device abuts or nearly abuts the dam to define a sealed cavity for the active area of the acoustic wave device between the top surface of the substrate and the face of the acoustic wave device.

* * * * *